United States Patent
Ahn

[11] Patent Number: 5,859,453
[45] Date of Patent: Jan. 12, 1999

[54] FLASH EEPROM CELL AND METHOD OF MAKING THE SAME

[75] Inventor: Byung Jin Ahn, Seoul, Rep. of Korea

[73] Assignee: Hyundai Electronics Industries Co., Ltd., Kyungki-Do, Rep. of Korea

[21] Appl. No.: 895,437

[22] Filed: Jul. 16, 1997

Related U.S. Application Data

[62] Division of Ser. No. 614,680, Mar. 13, 1996, Pat. No. 5,652,161.

[30] Foreign Application Priority Data

Mar. 14, 1995 [KR] Rep. of Korea ................. 1995 5204

[51] Int. Cl.6 ................. H01L 29/76; H01L 29/788; H01L 29/792
[52] U.S. Cl. ................. 257/314; 257/316; 257/324; 257/321
[58] Field of Search ................. 257/314, 315, 257/316, 321, 324

[56] References Cited

U.S. PATENT DOCUMENTS

| | | | |
|---|---|---|---|
| 5,138,410 | 8/1992 | Takebuchi | 257/315 |
| 5,138,573 | 8/1992 | Jeuch | 257/316 |
| 5,267,195 | 11/1993 | Kodama | 257/314 |
| 5,427,970 | 6/1995 | Hsue et al. | 257/321 |
| 5,445,984 | 8/1995 | Hong et al. | 437/43 |
| 5,449,941 | 9/1995 | Yamazaki et al. | 257/316 |
| 5,477,068 | 12/1995 | Ozawa | 257/314 |
| 5,557,566 | 9/1996 | Ochii | 257/316 |
| 5,569,945 | 10/1996 | Hong | 257/316 |

*Primary Examiner*—Tom Thomas
*Assistant Examiner*—Cuong Quang Nguyen
*Attorney, Agent, or Firm*—Scott C. Harris, Esq.

[57] ABSTRACT

The flash EEPROM cell of split-gate type according to the present invention can prevent the degradation of the tunnel oxide film of the cell due to the band-to-band tunneling and the secondary hot carrier which are generated by a high electric field formed at the overlap region between the junction region and the gate electrode when programming and erasure operations are performed by a high voltage to the structure in which the tunneling region is separated from the channel with a thick insulation film.

2 Claims, 5 Drawing Sheets

5,859,453

FLASH EEPROM CELL AND METHOD OF MAKING THE SAME

This is a divisional of application Ser. No. 08/614,680, filed Mar. 13, 1996 U.S. Pat. No. 5,652,161.

FIELD OF THE INVENTION

The present invention relates to a flash EEPROM cell and the method of making thereof and, more particularly to a flash EEPROM cell of split-gate type and the method of making thereof, which can improve the reliability of the device by separating the tunneling region and the channel.

BACKGROUND OF THE INVENTION

Generally, in the process of making a semiconductor device, a flash EEPROM (Electrically Erasable Read Only Memory) cell having both functions of electrical programming and erasing may be classified into a stack-gate structure and a split-gate structure.

As shown in FIG. 1A, a conventional flash EEPROM cell of stack-gate type has a structure in which a tunnel oxide film 5, a floating gate 6, an interpoly oxide film 11 and a control gate 12 are sequentially stacked on a silicon substrate 1 between a drain region 7 and a source region 8.

As shown in FIG. 1B, a conventional flash EEPROM cell of split-gate type has a structure in which a tunnel oxide film 5, a floating gate 6, an interpoly oxide film 11 and a control gate 12 are sequentially formed on a silicon substrate 1 between a drain region 7 and a source region 8, it has a stacked structure on the drain region's side 7 and it has a structure in which the control gate 12 comprising the upper layer of the stacked structure extends toward the source region 8. The silicon substrate 1 underlying the extended control gate 12 becomes a select gate channel region 9.

Though the stack-gate structure has an advantage in accomplishing a high density of the device because it can reduce the area per cell compared with the split-gate structure, it however has a disadvantage in that it is over-erased when being erased. Whereas, though the split-gate structure can overcome the disadvantage of the stack-gate structure, it has a disadvantage in accomplishing a high density of the device because it can not reduce the area per cell compared with the stack-gate.

On the one hand, the flash EEPROM cell of stack-gate type or split-gate type may perform the functions of programming and erasing when a high voltage is applied to the cell. When performing programming and erasing functions using a high voltage, a band-to-band tunneling and a secondary hot carrier are generated due to a strong electric field formed at the overlap region between a junction region and a gate electrode. However, the tunnel oxide film is degraded due to generation of the band-to-band tunneling and the secondary hot carrier because the tunnel oxide film of the cell is usually formed thin in thickness of about 100 Å, thereby reducing the reliability of the device.

SUMMARY OF THE INVENTION

The object of the present invention is to provide a flash EEPROM cell and the method of making the same, which can reduce the degradation of the tunnel oxide film due to a high voltage, while solving the over-erasure problem when the cell is erased.

To achieve the above object, a method of making a flash EEPROM cell, comprises the steps of:

removing a portion of a first oxide film and a nitride film which are sequentially formed on a silicon substrate through the etching process using the photoresist pattern as etching mask to expose a portion of the silicon substrate;

removing the photoresist pattern and then forming a second oxide film, by oxidizing the surface of the silicon substrate a portion of which is exposed;

forming a recess on the surface of the silicon substrate from which the second oxide film is removed, by removing the exposed portion of the second oxide film using the nitride film a portion of which is removed as etching mask, thereby the portion of the second oxide film covered with the nitride film a portion of which is removed remains intact;

forming a drain region on the recess portion of the silicon substrate;

forming a tunnel oxide film on the silicon substrate of the recess portion and then forming a first polysilicon layer on the entire structure;

sequentially removing the first polysilicon layer, the nitride film a portion of which is removed, the tunnel oxide film and the first oxide film a portion of which is removed through the etching process using the mask for a floating gate electrode to form a floating gate made of the first polysilicon layer;

implanting a impurity ion for controlling a threshold voltage to form a select gate channel region on the silicon substrate which is exposed on one side of the floating gate;

forming a select gate oxide film and an interpoly oxide film and then forming a second polysilicon layer on the entire structure; and forming a control gate of split structure by patterning the second polysilicon layer through the etching process using the mask for a control gate electrode and then forming a source region on the silicon substrate which is exposed on one side of the control gate.

A flash EEPROM cell comprises:

a silicon substrate on one portion of which a recess is formed;

a drain region formed on the recess portion of the silicon substrate;

a source region formed at the location of the silicon substrate which is spaced apart from the drain region;

a floating gate formed to overlap with a portion of the silicon substrate between the drain region and the source region and a portion of the drain region, the floating gate being electrically separated from the drain region with a thin insulation film and from the silicon substrate with a thick insulation film; and a control gate formed to extend up to the edge portion of the source region, the control gate being electrically separated from each of the floating gate and each of the silicon substrate by the oxide film.

BRIEF DESCRIPTION OF THE INVENTION

For fuller understanding of the nature and objects of the invention, reference should be made to the following detailed description and the accompanying drawings in which.

Similar reference characters refer to similar parts in the several views of the drawings.

DESCRIPTION OF THE INVENTION

Below, the present invention will be described in detail by reference to the accompanying drawings.

FIG. 2A to FIG. 2H show sectional views of the device for explaining the method of making a flash EEPROM cell according to the present invention.

Figure 1A:
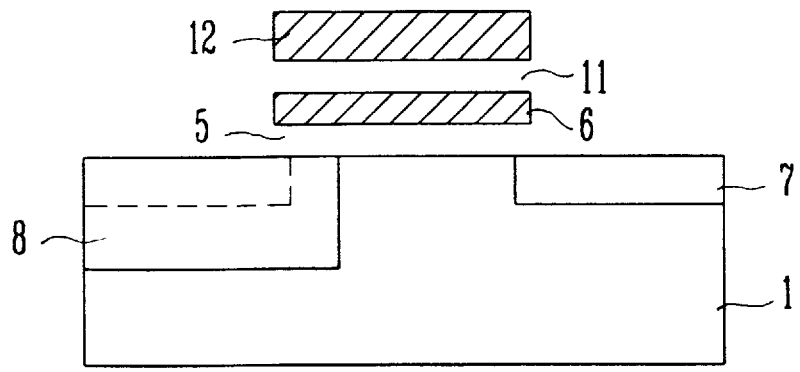
FIG. 1A shows a sectional view of a flash EEPROM cell of a conventional stack-gate type.
Figure 1B:
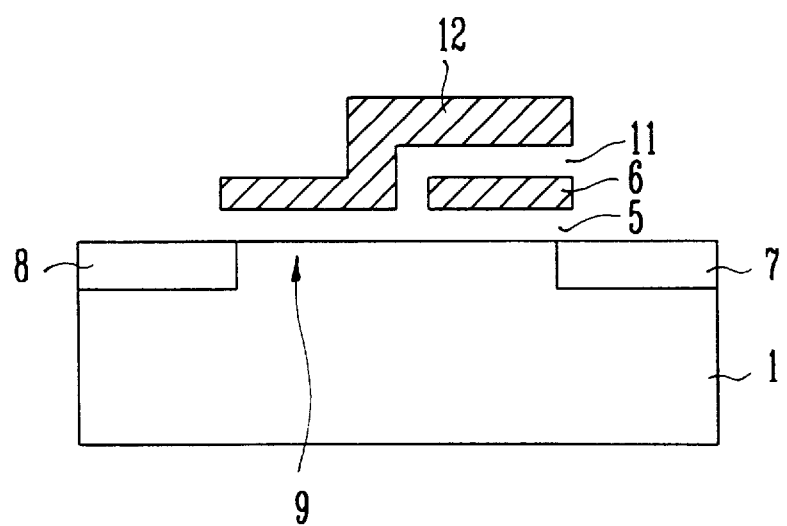
FIG. 1B shows a sectional view of a flash EEPROM cell of a conventional split-gate type.
Figure 2A:
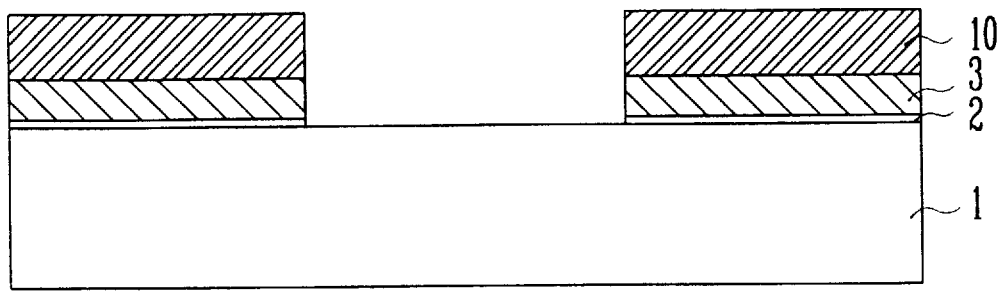
FIG. 2A to FIG. 2H show sectional views of the device for explaining the method of making a flash EEPROM cell according to the present invention.

In FIG. 2A. there is shown a silicon substrate 1 a portion of which is exposed by removing a portion of a first oxide film 2 and a portion of a nitride film 3 which are sequentially formed on the silicon substrate 1 through the etching process using a photoresist pattern 10 as etch mask, the first oxide film 2 is formed on the silicon substrate 1 in thickness of about 150 to 250 Å and the nitride film 3 is formed on the first oxide film 2 in thickness of about 400 to 600 Å.

Figure 2B:
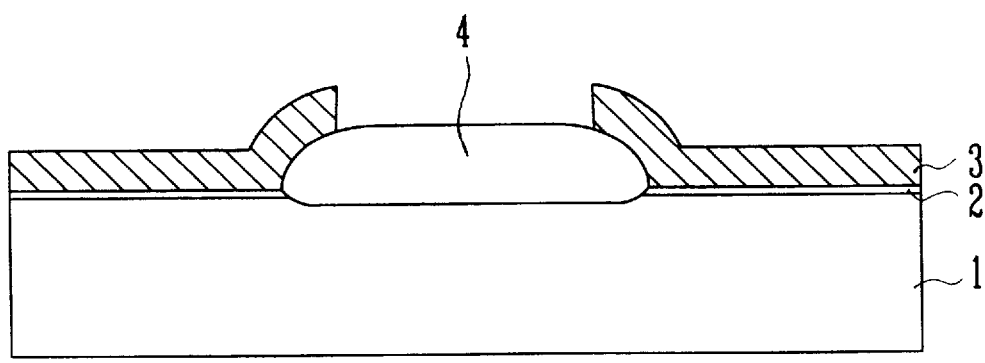

In FIG. 2B, there is shown a second oxide film 4 of 1500 to 2500 Å in thickness which, after the photoresist pattern 10 is removed, is formed by oxidizing the surface of the silicon substrate 1 a portion of which is exposed.

Figure 2C:
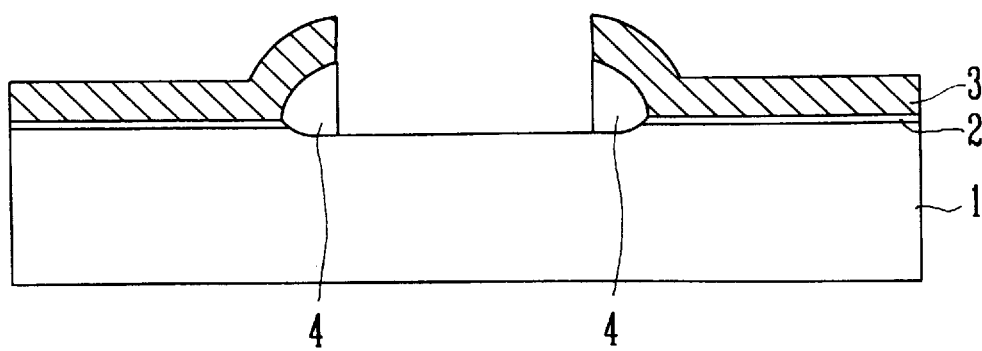

In FIG. 2C, there is shown the exposed portion of the second oxide film 4 which is removed through the dry etching process which uses the nitride film 3 a portion of which is removed as etching mask. As the exposed portion of the second oxide film 4 is removed, a recess is formed on the surface of the silicon substrate 1, but the second oxide film 4 which is covered by the nitride film 3 remain intact.

Figure 2D:
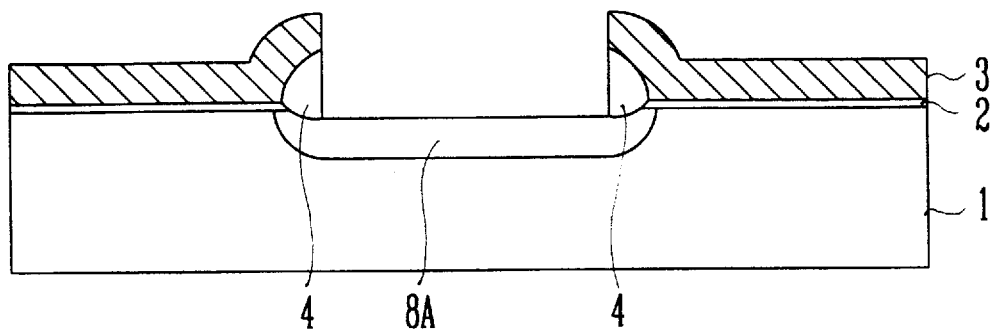

In FIG. 2D, there is shown a drain region 8A which is formed by annealing a high concentration of N-type impurity ion after it is implanted into the recess portion of the silicon substrate 1.

Figure 2E:
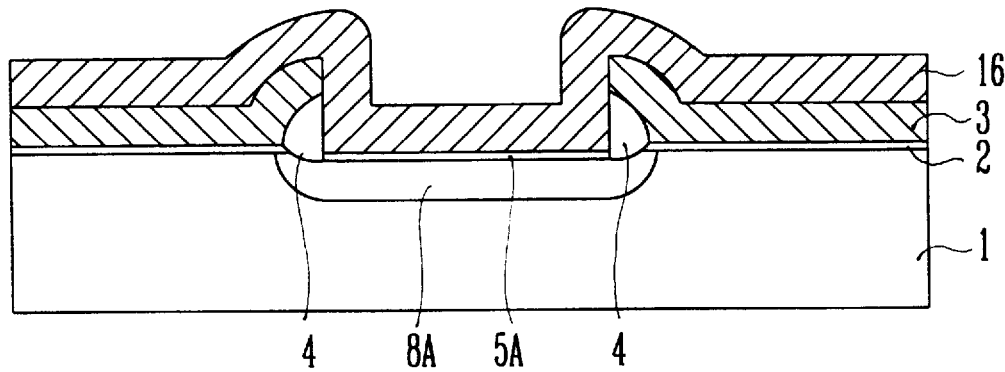

In FIG. 2E, there is shown a first polysilicon layer 16 which is formed on the entire structure after a tunnel oxide film 5A is formed on the exposed portion of the silicon substrate 1 in thickness of 80 to 120 Å.

Figure 2F:
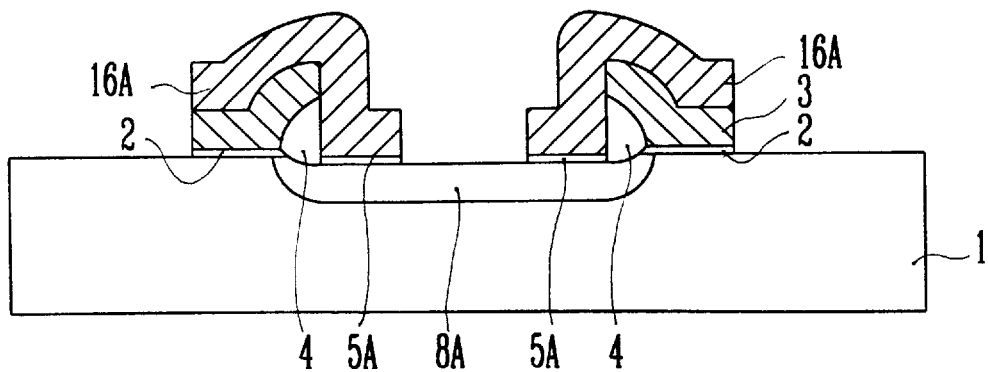

In FIG. 2F, there is shown a sectional view of the device in which a first polysilicon layer 16, the nitride film 3, the tunnel oxide film 5A and the first oxide film 2 are sequentially patterned through dry etching process using the mask for a floating gate electrode. The first patterned polysilicon layer 16 becomes a floating gate 16A. Also, in FIG. 2F, there are shown two floating gates 16A which are spaced apart on the basis of the central portion of the drain region 8A.

Figure 2G:
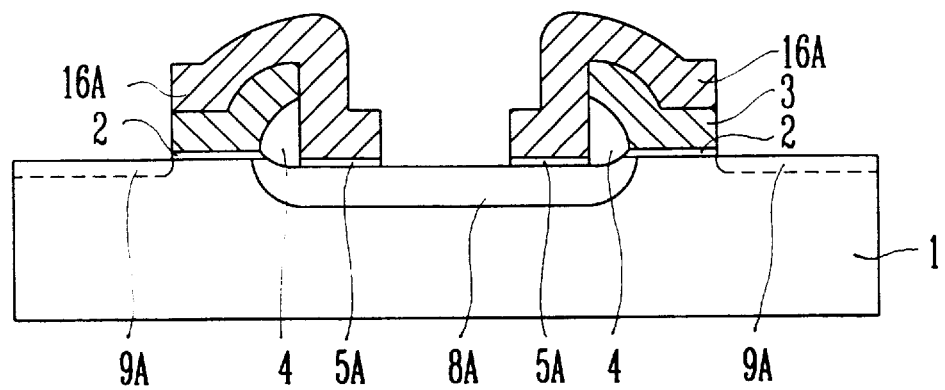

In FIG. 2G, there are shown select gate channels 9A each of which is formed by implanting the impurity ion for controlling a threshold voltage into the exposed portion of the silicon substrate 1 out of the two floating gate 16A.

Figure 2H:
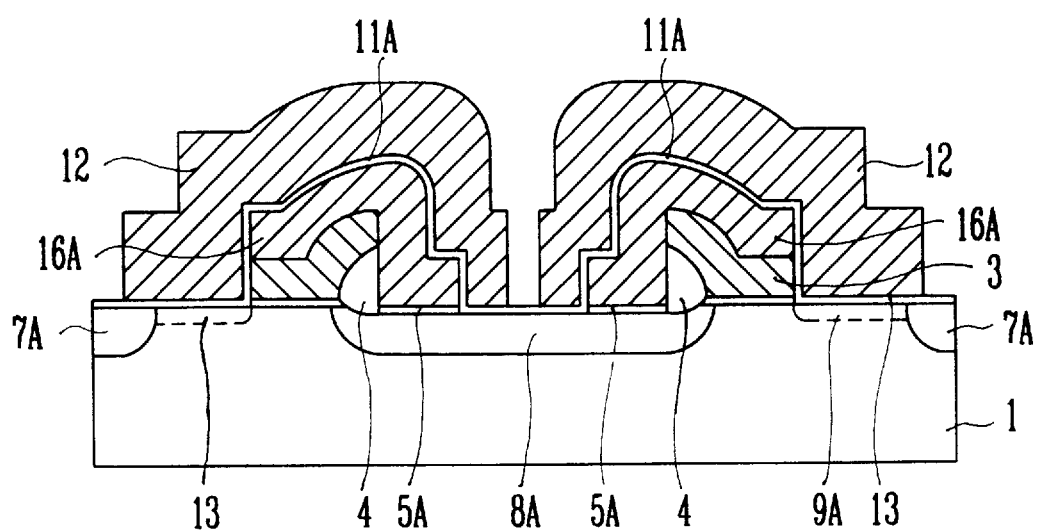

In FIG. 2H, there is shown a sectional view of the device in which a select gate oxide film 13 and an interpoly oxide film 11A are simultaneously grown on the entire structure in which a select gate channel 9A is formed, after the second polysilicon layer is formed, two control gates 12 each of which covers each of two floating gates 16A are formed by patterning the second polysilicon layer through dry etching process using the mask for a control gate electrode, and each of source regions 7A is formed on the silicon substrate 1 out of the two control gates 12 by implanting a high concentration of N-type impurity ion.

Two flash EEPROM cells having a common drain region 8A are completed through the above mentioned processes.

The flash EEPROM cell manufactured according to the present invention has a structure, in which a silicon substrate 1 with a recess formed on a portion thereof is provided; a drain region 8A is formed on the recess portion of the silicon substrate 1; source regions 7A are formed at the location of the silicon substrate 1 which is spaced apart from the drain region 8A; floating gate 16A is formed to be overlapped with a portion of the silicon substrate 1 between the drain region 8A and the source regions 7A and a portion of the drain region 8A, the floating gates 16A being electrically isolated from the drain region 8A with a thin insulation film and from the silicon substrate 1 with a thick insulation film; control gate 12 covering the floating gate 16A is extended up to the edge portion of the source region 7A, the control gates 12 being electrically isolated from each of the floating gate 16A and the silicon substrate 1 by the oxide film.

The thin insulation film in the above is formed with the tunnel oxide film in thickness of 80 to 120 Å and the thick insulation film is formed by depositing at least one insulating material in thickness of 150 to 1000 Å.

Now, the operation of the flash EEPROM cell according to the present invention will be explained by reference to FIG. 3A and FIG. 3B.

Figure 3A:
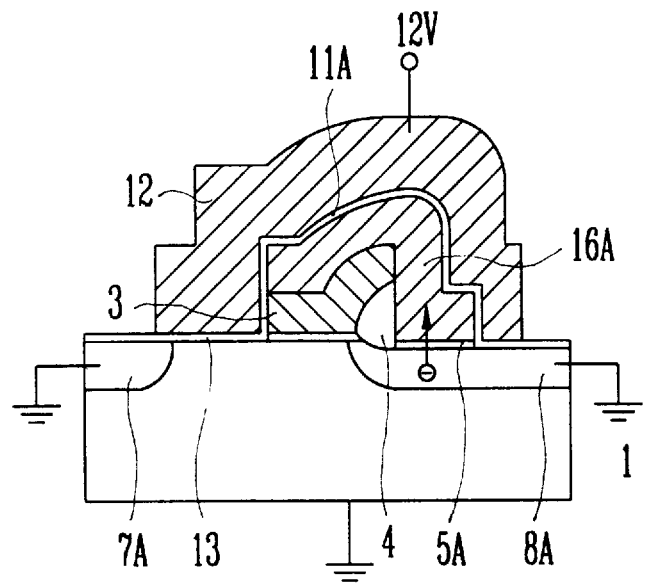
FIG. 3A and FIG. 3B, are the state diagrams of the operation for explaining the flash EEPROM cell manufactured according to the present invention.
Figure 3B:
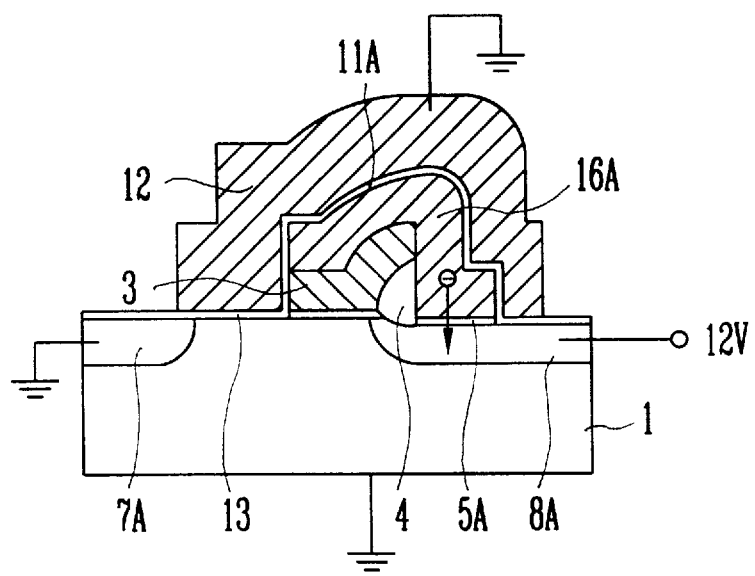

FIG. 3A and FIG. 3B show the states of the operations for explaining the flash EEPROM cell which is manufactured in accordance with the present invention.

FIG. 3A is a state diagram of the program operation of the flash EEPROM cell.

When a high voltage of about 12 V is applied to the control gate 12 with the silicon substrate 1, the source region 7A and the drain region 8A grounded, electrons are charged at the floating gate 16A by a fowler-nordheim tunneling due to high electric field between the drain region 8A and the floating gate 16A in the tunnel oxide film 5A, thereby completing the program operation.

FIG. 3B is a state diagram of the erasure operation of the flash EEPROM cell.

When a high voltage of about 12 V is applied to the drain region 8A with the silicon substrate 1, the source region 7A and the control gate 12 grounded, the electrons charged at the floating gate 16A are discharged from the tunnel oxide film 5A by a fowler-nordheim tunneling due to a high electric field between the drain region 8A and the floating gate 16A, thereby completing the erasure operation.

As mentioned above, the flash EEPROM cell of split-gate type according to the present invention can prevent the degradation of the tunnel oxide film of the cell due to the band-to-band tunneling and the secondary hot carrier generated by a high electric field which is formed at the overlap region between the junction region and the gate electrode when the programming and erasure operations are performed by a high voltage to the structure in which the tunneling region is separated from the channel with a thick insulation film, while maintaining the advantage of split-gate structure which can prevent an over-erasure when the cell is driven.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash EEPROM cell in a silicon substrate comprising:
   a recess formed in a portion of the silicon substrate;

a drain region formed in the silicon substrate under said recess;

a source region formed at a portion of said silicon substrate which is spaced apart from said drain region;

an insulation film formed with a duplicate structure of oxide/nitride films to cover with a portion of said silicon substrate exposed between said drain region and said source region, and a portion of said drain region;

a tunnel oxide film formed on a portion of said drain region so that said tunnel oxide film is joined to a side of said insulation film;

a select gate oxide film formed on said silicon substrate exposed between said insulation film and said source region;

a floating gate formed on said insulation film and said tunnel oxide film; and a control gate formed over said floating gate and said select gate oxide film, said control gate being electrically separated from said floating gate by an interpoly oxide film.

2. A flash EEPROM cell comprising:

a recess formed in a portion of a silicon substrate;

a common drain region formed in said silicon substrate under said recess;

a first source region formed on a portion of said silicon substrate which is spaced apart from a first side of said common drain region;

a second source region formed on a portion of said silicon substrate which is spaced apart from another side of said common drain region;

a first floating gate formed to overlap with a portion of said silicon substrate between said common drain region and said first source region and a portion of a side of said common drain region, and a second floating gate formed to overlap with a portion of said silicon substrate between said common drain region and said second source region and a portion of another side of said common drain region, each of said floating gates being electrically separated from said common drain region by a tunnel oxide film and from said silicon substrate by an insulation film which formed with a duplicate structure of oxide/nitride films; and a first control gate covering said first floating gate formed to extend up to an edge portion of said first source region, and a second control gate covering said second floating gate formed to extend up to an edge portion of said second source region, each of said control gates being electrically separated from each of said floating gates by an interpoly oxide film and from said silicon substrate by a select gate oxide film.

* * * * *